United States Patent
Tan et al.

(10) Patent No.: US 9,008,518 B2
(45) Date of Patent: Apr. 14, 2015

(54) OPTICAL TRANSMITTER AND RECEIVER CIRCUIT ARRANGEMENT

(71) Applicant: Hewlett-Packard Development Company, L.P., Houston, TX (US)

(72) Inventors: Michael Renne Ty Tan, Palo Alto, CA (US); Glenn C. Simon, Roseville, CA (US); Sagi Varghese Mathai, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/753,949

(22) Filed: Jan. 30, 2013

(65) Prior Publication Data

US 2014/0212147 A1  Jul. 31, 2014

(51) Int. Cl.
*H04B 10/00* (2013.01)
*H05K 3/00* (2006.01)

(52) U.S. Cl.
CPC .................................... *H05K 3/00* (2013.01)

(58) Field of Classification Search
USPC ......... 398/135, 136, 137, 138, 139, 164, 158, 398/159, 202, 208, 182; 385/88, 89, 90, 92, 385/93; 361/715, 695, 697, 690, 683
See application file for complete search history.

(56) References Cited

U.S. PATENT DOCUMENTS

| | | | |
|---|---|---|---|
| 5,200,631 A | 4/1993 | Austin et al. | |
| 6,052,281 A * | 4/2000 | Hardt et al. | 361/690 |
| 6,586,678 B1 | 7/2003 | Rosenberg et al. | |
| 7,317,617 B2 * | 1/2008 | Meadowcroft et al. | 361/715 |
| 7,366,214 B2 | 4/2008 | Liu et al. | |
| 2014/0056592 A1 * | 2/2014 | McColloch et al. | 398/135 |

FOREIGN PATENT DOCUMENTS

| | | |
|---|---|---|
| CN | 2613771 Y | 4/2004 |
| JP | 8037500 A | 2/1996 |
| JP | 2010272804 A | 12/2010 |

OTHER PUBLICATIONS

Seurin, J-F. et al., "Efficient Vertical-cavity Surface-emitting Lasers for Infrared Illumination Application", http://princetonoptronics.com/pdfs/7952-15.pdf, Mar. 25, 2011, 10 pgs.

* cited by examiner

*Primary Examiner* — Hanh Phan
(74) *Attorney, Agent, or Firm* — Tarolli, Sundheim, Covell & Tummino

(57) ABSTRACT

A system includes an optical transmitter package comprising an optical transmitter to generate optical transmission signals based on electrical transmission signals. The system also includes an optical receiver package comprising an optical receiver to generate electrical reception signals based on optical reception signals. The system further includes a printed circuit board (PCB) on which the optical transmitter package and the optical receiver package are mounted. The PCB includes a heat generating circuit component. The optical transmitter package can be mounted to the PCB to subjected to less heat from the heat generating circuit component than the optical receiver package.

17 Claims, 3 Drawing Sheets

OPTICAL TRANSMITTER AND RECEIVER CIRCUIT ARRANGEMENT

BACKGROUND

Optical transceiver systems, such as including optical transmitters (e.g., vertical cavity surface emitting lasers (VCSELs)) and optical receivers (e.g., photodiodes), can be implemented for electrical to optical data and optical to electrical transmission purposes. On a printed circuit board (PCB), the optical transceiver packages can be mounted in close proximity to an application specific integrated circuit (ASIC) that can include processing components, such as requiring high power and thus generating heat. Optical transmitters can be temperature sensitive, such that the reliability of the optical transmitters can decrease with increasing operating temperature.

DETAILED DESCRIPTION

Figure 1:
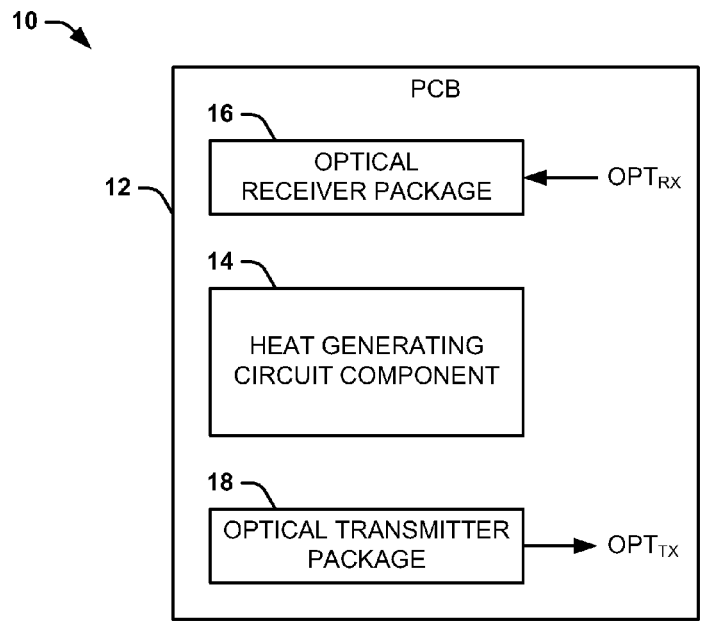
FIG. 1 illustrates an example of an optical computer hardware system.

FIG. 1 illustrates an example of an optical computer hardware system 10. The optical computer hardware system 10 can be implemented in a variety of computer systems, such as personal computers (PCs) or enterprise server systems. The optical computer hardware system 10 includes a printed circuit board (PCB) 12 that is implemented to mount circuit components. In the example of FIG. 1, the PCB 12 includes a heat generating circuit component 14, an optical receiver package 16, and an optical transmitter package 18.

The heat generating circuit component 14 can be configured as an application specific integrated circuit (ASIC), such as may include any of a variety of processors that may consume a large amount of power, thus generating a large amount of heat. As used herein, a large amount of heat can refer to any amount of heat that is sufficient to cause deleterious operational effects for optical transmitters, such as including VCSELs implemented in the optical transmitter package 18. As an example, the heat generating circuit component 14 can include a heat sink. Additionally or alternatively, the optical computer hardware system 10 can include a fan configured to generate an airflow across the heat generating circuit component 14. For example, the heat generating circuit component 14 can be configured as an ASIC that includes an optical communications controller to generate electrical transmission signals that are provided to the optical transmitter package 18 and/or to receive electrical transmission signals that are provided from the optical receiver package 16.

In the example of FIG. 1, the optical receiver package 16 is configured to receive optical reception signals $OPT_{RX}$, such as can be provided from optical systems externally with respect to the PCB 12 (e.g., via a fiber optic cable or optical waveguide). As an example, the optical receiver package 16 can generate electrical reception signals based on the optical reception signals $OPT_{RX}$, such as can be provided to an ASIC (e.g., the heat generating circuit component 14). In addition, the optical transmitter package 18 can be configured to generate optical transmission signals $OPT_{TX}$, that can be provided to optical systems externally with respect to the PCB 12. As an example, the optical transmitter package 18 can generate the optical transmission signals $OPT_{TX}$ in response to electrical transmission signals, such as provided from an ASIC (e.g., the heat generating circuit component 14).

As a further example, the optical receiver package 16 can be an electronic/optical circuit package that includes one or more optical receiving components (e.g., photodiodes) only, or includes both optical receiving components and non-functioning optical transmission components (e.g., vertical cavity surface emitting lasers (VCSELs)), such that the optical receiver package 16 does not include functioning optical transmission components. The optical transmitter package 18 can be an electronic/optical circuit package that includes one or more optical transmission components (e.g., VCSELs) only, or includes both non-functioning optical receiving components (e.g., photodiodes) and functioning optical transmission components, such that the optical transmitter package 18 does not include functioning optical receiving components. Therefore, in the example of FIG. 1, the optical computer hardware system 10 does not implement an optical transceiver package that includes both optical reception components and optical transmission components. Instead, the example optical computer hardware system 10 separates the optical reception components and the optical transmission components into separate packages, which are demonstrated as the optical receiver package 16 and the optical transmitter package 18, respectively.

Because heat can affect optical transmission components differently than optical reception components, the optical receiver package 16 and the optical transmitter package 18 can be mounted on the PCB 12 in a manner that the optical receiver package 16 is subjected to more heat from the heat generating circuit component 14 than the optical transmitter package 18. For example, the optical receiver package 16 can be mounted closer to the heat generating circuit component 14 than the optical transmitter package 18. As another example, the optical transmitter component 18 can be mounted to the PCB 12 in a location so that heat provided from the heat generating circuit component 14 is reduced with respect to the optical transmitter component 18 based on an airflow, such as generated from a fan. Therefore, inefficiencies associated with heat affecting the optical transmission components (e.g., VCSELs) in the optical transmitter package 18 can be mitigated.

Figure 2:
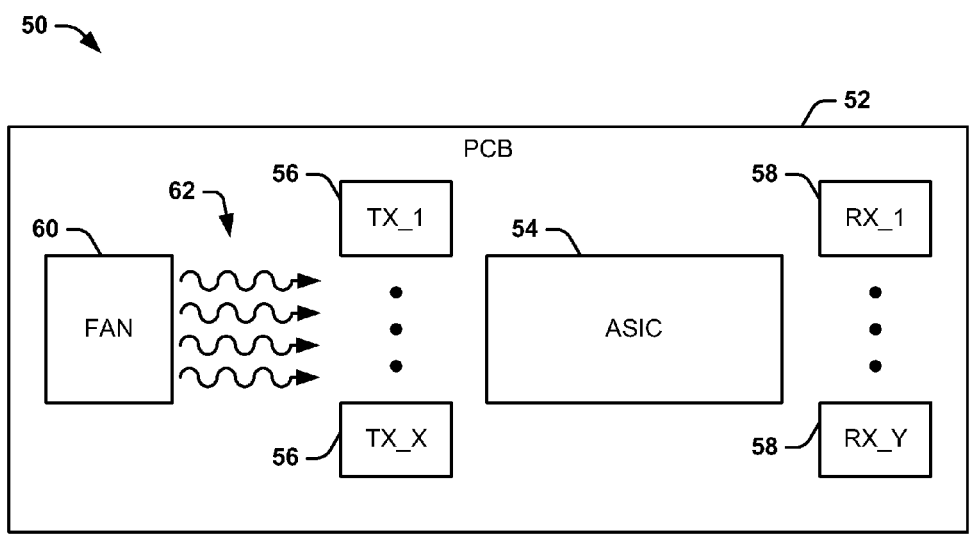
FIG. 2 illustrates another example of an optical computer hardware system.

FIG. 2 illustrates another example of an optical computer hardware system 50. The optical computer hardware system 50 can be implemented in a variety of computer systems, such as PCs or enterprise server systems, for example. The optical computer hardware system 50 includes a PCB 52 that is implemented to mount circuit components. In the example of FIG. 2, the PCB 52 includes an ASIC 54, a plurality X of optical transmitter packages 56, a plurality Y of optical receiver packages 58, and a fan 60, where X and Y are integers that are greater than or equal to one.

The ASIC 54 can correspond to the heat generating component 14 in the example of FIG. 1, and thus can include a variety of processors or other circuit components that may consume a large amount of power, thus generating a large amount of heat. In an effort to cool the ASIC 54, the ASIC 54 can include a heat sink. In addition, the fan 60 is configured to generate an airflow across the ASIC 54, demonstrated in the example of FIG. 2 by the wavy arrows 62, to also cool the ASIC 54.

In some examples, the ASIC 54 can be configured as an ASIC that includes an optical communications controller.

The ASIC 54 can generate electrical transmission signals that are provided to the optical transmitter packages 56. In addition or as an alternative, the ASIC 54 can receive electrical transmission signals that are provided from the optical receiver packages 58 in response to optical signals received by the optical receiver packages 58.

The optical transmitter packages 56 can be mounted on the PCB 52 in an arrangement that subjects the optical transmitter packages 56 to less heat from the ASIC 54 than the optical receiver packages 58. In the example of FIG. 2, the optical transmitter packages 56 are mounted upstream of the ASIC 54 with respect to the airflow 62, whereas the optical receiver packages 58 are mounted downstream of the ASIC 54 with respect to the airflow 62. As a result, because the optical transmitter packages 56 are mounted upstream of the ASIC 54 with respect to the airflow 62, the heat from the ASIC 54 is blown away from the optical transmitter packages 56. Thus, instead of being provided to the optical transmitter packages 56, the heat from the ASIC 54 is forced over the optical receiver packages 58. The optical receiver packages 58 are significantly much less susceptible to deleterious effects from heat than the optical transmitter packages 56. Therefore, the optical computer hardware system 50 can be much more reliable with respect to the generated and received optical signals (e.g., the optical transmission signals $OPT_{TX}$ and the optical reception signals $OPT_{RX}$). In addition, such reliability can further provide a less frequent need for repair and increased longevity of the optical transmitter packages 56.

The arrangement of the optical transmitter packages 56 and the optical receiver packages 58 is not limited to the arrangement demonstrated in the example of FIG. 2. For example, the optical transmitter packages 56 and the optical receiver packages 58 can both be arranged upstream of the ASIC 54 with respect to the airflow 62, such that the optical receiver packages 58 are positioned closer to the ASIC 54 than the optical transmitter packages 56. For example, the optical receiver packages 58 can be interposed between the optical transmitter packages 56 and the ASIC 54. In such an arrangement, the optical receiver packages 58 are downstream of the optical transmitter packages 56 with respect to the airflow 62. As another example, at least one of the optical transmitter packages 56 and/or the optical receiver packages 58 can be mounted laterally relative to the ASIC 54 with respect to the direction of airflow 62. For example, the optical receiver packages 58 and the optical transmitter packages 58 can be arranged along side-edges of the ASIC 54 extending along the direction of the airflow 62 and spaced-apart from the side-edges, respectively.

As another example, the fan 60 is not limited to being mounted to the PCB 52 as demonstrated in the example of FIG. 2. For example, the fan 60 could instead be mounted in a rack into which the PCB 52 is inserted, such that the airflow 62 remains as demonstrated in the example of FIG. 2 to blow the heat from the ASIC 54 away from the optical transmitter packages 56. As yet another example, the fan 60 could be configured to pull the airflow 62 instead of push the airflow 62. Therefore, the arrangement of the optical transmitter packages 56 and the optical receiver packages 58 could be reversed with respect to the ASIC 54. Alternatively, the fan 60 could be located on the opposite side of the PCB 52 than as demonstrated in the example of FIG. 2, such that the fan 60 pulls the airflow 62 to pull the heat from the ASIC 54 away from the optical transmitter packages 56.

Figure 3:
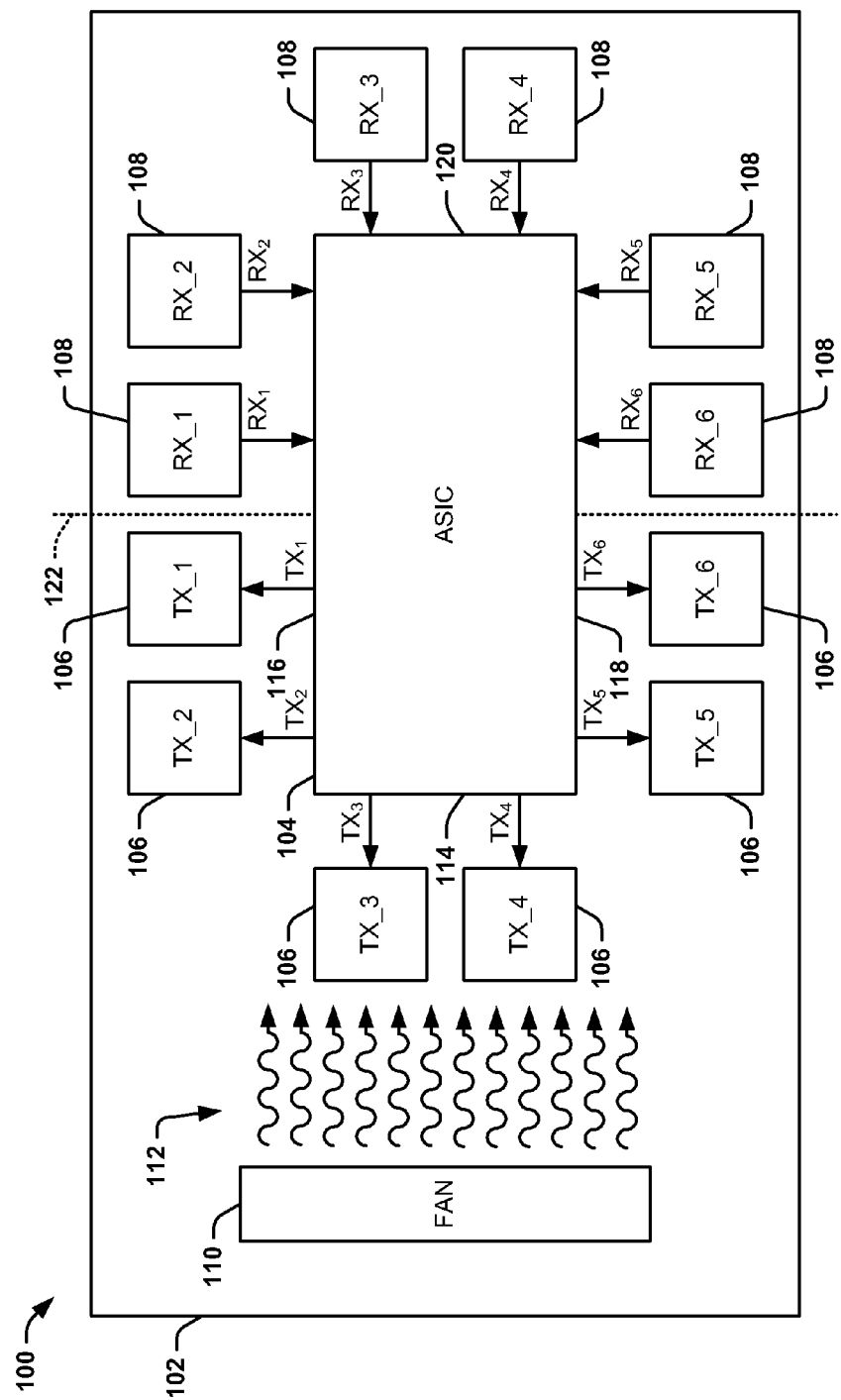
FIG. 3 illustrates yet another example of an optical computer hardware system.

FIG. 3 illustrates yet another example of an optical computer hardware system 100. The optical computer hardware system 100 can be implemented in a variety of computer systems, such as PCs or enterprise server systems. The optical computer hardware system 100 includes a PCB 102 that is implemented to mount circuit components. In the example of FIG. 3, the PCB 102 includes an ASIC 104, a plurality of optical transmitter packages 106, a plurality of optical receiver packages 108. In the example of FIG. 3, the optical computer hardware system 100 includes a plurality of six of each of the optical transmitter packages 106, demonstrated as TX_1 through TX_6, and of each of the optical receiver packages 108, demonstrated as RX_1 through RX_6.

The ASIC 104 can correspond to the heat generating component 14 in the example of FIG. 1, and thus may consume a large amount of power, thus generating a large amount of heat. As an example, the ASIC 104 can include a heat sink. In addition, a fan 110 is configured to generate airflow across the ASIC 104, demonstrated in the example of FIG. 3 by the wavy arrows 112. In the example of FIG. 3, the ASIC 104 is configured as an optical communications controller to generate electrical transmission signals $TX_1$ through $TX_6$ that are provided to the respective optical transmitter packages 106 for generating corresponding optical transmission signals. The ASIC is also configured to receive electrical transmission signals $RX_1$ through $RX_6$ that are provided from the respective optical receiver packages 108 in response to received optical signals.

The optical transmitter packages 106 can be mounted on the PCB 102 in a manner that the optical transmitter packages 106 are subjected to substantially less heat from the ASIC 104 than the optical receiver packages 108. In the example of FIG. 3, the optical transmitter packages 106 labeled TX_3 and TX_4 are mounted upstream of the ASIC 104 with respect to the airflow 112 and are arranged in a spaced-apart relationship adjacent to a leading edge 114 of the ASIC 104 with respect to the airflow 112. In addition, the optical transmitter packages 106 labeled TX_1, TX_2, TX_5, and TX_6 are mounted adjacent to and laterally extending along opposite side-edges 116 and 118 of the ASIC 104 with respect to the direction of airflow 112. The optical receiver packages 108 labeled RX_3 and RX_4 are mounted downstream of the ASIC 104 along a trailing-edge 120 of the component 104 with respect to the direction of airflow 112. The optical receiver packages 108 labeled RX_1, RX_2, RX_5, and RX_6 are mounted adjacent the opposed side-edges 116 and 118 of the ASIC 104 and downstream from the laterally mounted transmitter packages TX_1, TX_2, TX_5, and TX_6 with respect to the direction of airflow 112. By this arrangement, the optical transmitter packages 106 labeled TX_1, TX_2, TX_5, and TX_6 are less susceptible to the heat from the ASIC 104 than the optical receiver packages 108 labeled RX_1, RX_2, RX_5, and RX_6 based on the airflow 112. However, each of the optical transmitter packages 106 and the optical receiver packages 108 can be positioned substantially equidistant from the ASIC for communication of electrical transmitter and receiver signals, respectively. Accordingly, the optical computer hardware system 100 can be much more reliable with respect to the generated and received optical signals (e.g., the optical transmission signals $OPT_{TX}$ and the optical reception signals $OPT_{RX}$).

The arrangement of the optical transmitter packages 106 labeled TX_1, TX_2, TX_5, and TX_6 and the optical receiver packages 108 labeled RX_1, RX_2, RX_5, and RX_6 is not limited to the arrangement demonstrated in the example of FIG. 3. In the example of FIG. 3, a virtual dividing line 122 extends through the side-edges 116 and 118 generally perpendicular to the direction of airflow 112. In this example, the line 122 divides the optical transmitter packages 106 labeled TX_1, TX_2, TX_5, and TX_6 upstream of the optical receiver packages 108 labeled RX_1, RX_2, RX_5, and RX_6 at the locations laterally relative to the ASIC 104 relative to the airflow 112. The dividing line 122 can be a line that is determinative of an acceptable amount of heat upstream of the dividing line 122 relative to the heat downstream of the dividing line 122 based on the airflow 112. Thus, the dividing line 122 can correspond to a region between leading- and trailing-edges 114 and 120, respectively, of the ASIC 104 at which it is acceptable to mount optical transmitter packages (e.g., the optical transmitter packages 106) upstream of the dividing line 122. In the example of FIG. 3, the dividing line 122 is located at an approximate half of the ASIC 104. In other examples, however, it can be determined (e.g., via thermal testing) that the dividing line 122 should be closer to or farther away from the fan 110.

In addition, although the optical computer hardware system 100 of FIG. 3 demonstrates an equal quantity of the optical transmitter packages 106 and the optical receiver packages 108, the optical computer hardware system 100 can include, for example, a disparate number of optical transmitter packages 106 relative to the number of optical receiver packages 108. As another example, the optical receiver packages 108 can be mounted more proximal to the ASIC 104 than the optical transmitter packages 106. Furthermore, the mounting of the optical transmitter packages 106 and the optical receiver packages 108 need not be arranged symmetrically, as demonstrated in the example of FIG. 3, but could instead be asymmetrically arranged. Therefore, the mounting of the optical transmitter packages 106 and the optical receiver packages 108 can be arranged in a variety of ways. In addition, similar to as described previously regarding the example of FIG. 2, the fan 110 is not limited to being mounted to the PCB 102, and could be configured to pull the airflow 112 instead of pushing it, thus reversing the location of the optical transmitter packages 106 and the optical receiver packages 108 relative to the location of the ASIC 116 or the fan 110.

Figure 4:
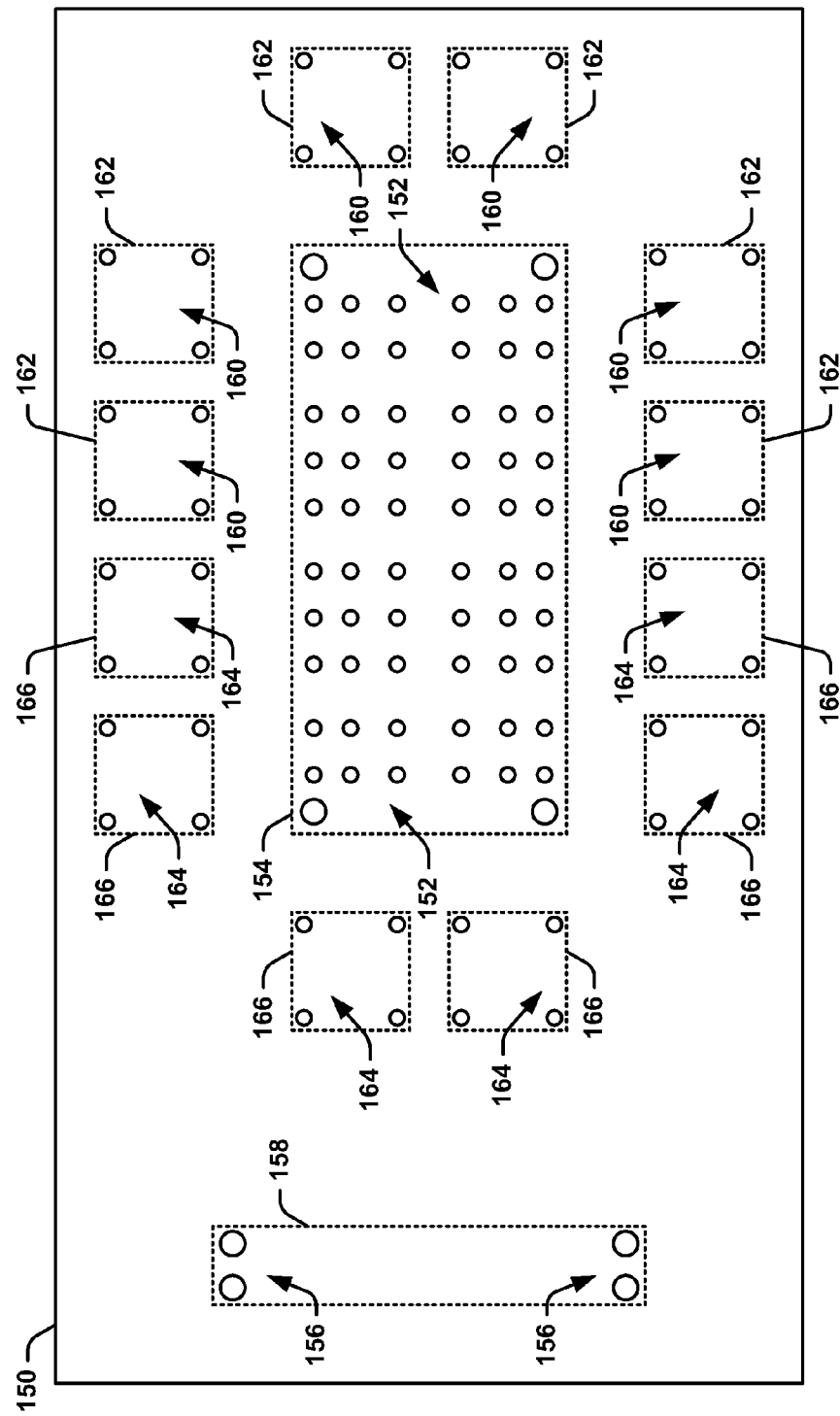
FIG. 4 illustrates an example of a printed circuit board (PCB).

FIG. 4 illustrates an example of a printed circuit board (PCB) 150. The PCB 150 can correspond to the PCB 102 in the example of FIG. 3. The PCB 150 is implemented to mount circuit components, such as for an optical computer hardware system (e.g., the optical computer hardware system 100 in the example of FIG. 3). Thus, the PCB 150 includes several sets of couplings for mounting hardware components, which can include an ASIC, a plurality of optical transmitter packages, a plurality of optical receiver packages, and a fan. As described herein, the term "couplings" can describe any of a variety of ways with which to mount circuit components onto the PCB 150, including solder bumps, surface mounts, receptacles, through-holes, and/or any other manner in which hardware components can be mounted to the PCB 150.

In the example of FIG. 4, the PCB 150 includes a first set of couplings 152 to receive a heat generating component (demonstrated by dashed lines 154), such as for mounting the ASIC 104 in the example of FIG. 3 to the PCB 150. The first set of couplings 152 can include electrical connections to the PCB 150, such as can allow conductivity between the ASIC and electrical traces (not shown) on the PCB 150 that can be provided to other devices on the PCB 150 or other parts of the associated computer system. The first set of couplings 152 can also include fastening means (e.g., through-holes, etc.).

The PCB 150 also includes a second set of couplings 156 to receive a fan (demonstrated by dashed lines 158), such as for mounting the fan 110 in the example of FIG. 3 to the PCB 150. The second set of couplings 156 can be arranged such that the fan can provide an airflow across the heat generating component received at the first set of couplings 152. The PCB 150 further includes a third set of couplings 160 for receiving optical receiver packages (demonstrated by dashed lines 162) and a fourth set of couplings 164 for receiving optical transmitter packages (demonstrated by dashed lines 166). In the example of FIG. 4, the third set of couplings 160 is demonstrated as being implemented for the mounting of six optical receiver packages, such as the optical receiver packages 108. Similarly, the fourth set of couplings 164 is demonstrated as being implemented for the mounting of six optical transmitter packages, such as the optical transmitter packages 106. The second, third, and fourth sets of couplings 156, 160, and 164 can include electrical connections to the PCB 150, such as can allow conductivity between the respective devices and electrical traces (not shown) on the PCB 150, as well as fastening means (e.g., through-holes, etc.).

The arrangement of the sets of couplings 152, 156, 160, and 164 can be such that the respective devices can be mounted on the PCB 150 in a manner that the optical transmitter packages are subjected to substantially less heat from the heat generating component than the optical receiver packages, such as being arranged for mounting the circuit components disclosed with respect to the optical computer hardware system 100 in the example of FIG. 3. In the example of FIG. 4, the fourth set of couplings 164 are arranged such that the optical transmitter packages can be mounted upstream of the heat generating component with respect to the direction of airflow generated by the fan mounted at the second set of couplings 156. In addition, some of the fourth set of couplings 164 are arranged with respect to the first set of couplings 152 to mount some of the optical transmitter packages laterally (i.e. next to) adjacent opposing side-edges of the heat generating component with respect to the airflow generated by the fan mounted to the second set of couplings 156.

The third set of couplings 160 are arranged such that the optical receiver packages can be mounted downstream of the heat generating component with respect to the airflow generated by the fan mounted at the second set of couplings 156. In addition, some of the third set of couplings 160 are arranged with respect to the first set of couplings 152 to mount some of the optical receiver packages laterally (i.e. next to) the heat generating component downstream of the optical transmitter packages with respect to the airflow generated by the fan mounted to the second set of couplings 156. For example, the distribution and arrangement of couplings 160 can be symmetrical to the couplings 164 taken with respect to the couplings 152. Accordingly, the associated optical computer hardware system can be much more reliable with respect to the operation of the optical transmitter packages mounted to the fourth set of couplings 164 with respect to the heat from the heat generating component mounted to the first set of couplings 152.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but is not limited to, and the term "including" means including but is not limited to. The term "based on" means based at least in part on.

What is claimed is:

1. A system comprising:
   a plurality of optical transmitter packages each comprising a respective optical transmitter to generate optical transmission signals based on electrical transmission signals; and
   a plurality of optical receiver packages each comprising a respective optical receiver to generate electrical reception signals based on optical reception signals; and
   a printed circuit board (PCB) on which the plurality of optical transmitter packages and the plurality of optical receiver packages are mounted, the PCB comprising a heat generating circuit component, the plurality of optical transmitter packages being mounted to the PCB to be subjected to less heat from the heat generating circuit component than the plurality of optical receiver packages.

2. The system of claim 1, wherein the plurality of optical receiver packages are mounted closer to the heat generating circuit component than the plurality of optical transmitter packages.

3. The system of claim 1, further comprising a fan to generate airflow across the heat generating circuit component.

4. The system of claim 3, wherein the plurality of optical transmitter packages are mounted upstream of the heat generating circuit component with respect to a direction of the airflow.

5. The system of claim 3, wherein the plurality of optical receiver packages are mounted downstream of the heat generating circuit component with respect to a direction of the airflow.

6. The system of claim 3, wherein the plurality of optical transmitter packages are mounted substantially upstream of the plurality of optical receiver packages with respect to a direction of the airflow.

7. The system of claim 6, wherein the plurality of optical transmitter packages and the plurality of optical receiver packages are mounted laterally relative to the heat generating circuit component and the direction of the airflow.

8. The system of claim 1, wherein the optical transmitter of at least one of the plurality of optical transmitter packages is a vertical cavity surface emitting laser (VCSEL).

9. The system of claim 1, wherein the heat generating circuit component is an application specific integrated circuit (ASIC) comprising a circuit to generate the electrical transmission signals and to receive the electrical reception signals.

10. The system of claim 1, further comprising a fan to generate airflow across the heat generating circuit component, the plurality of optical transmitter packages and the plurality of optical receiver packages, wherein the plurality of optical transmitter packages are mounted upstream of the heat generating circuit component with respect to a direction of the airflow and the plurality of optical receiver packages are mounted downstream of the heat generating circuit component with respect to a direction of the airflow.

11. The system of claim 1, wherein the heat generating circuit is mounted on the PCB and wherein the plurality of optical receiver packages are mounted closer to the heat generating circuit component on the PCB than the plurality of optical transmitter packages.

12. A printed circuit board (PCB) comprising:
   a first set of couplings to receive a heat generating circuit component;
   a second set of couplings to receive a fan to generate airflow across the heat generating circuit component;
   a third set of couplings to receive a plurality of optical receiver packages to generate electrical reception signals based on optical reception signals; and
   a fourth set of couplings to receive a plurality of optical transmitter packages to generate optical transmission signals based on electrical transmission signals, wherein the fourth set of couplings are arranged on the PCB in a manner that the plurality of optical transmitter packages are subjected to less heat from the heat generating circuit component than the plurality of optical receiver packages based on the airflow.

13. The PCB of claim 12, wherein the fourth set of couplings are arranged on the PCB substantially upstream of the first set of couplings with respect to the direction of airflow.

14. The PCB of claim 12, wherein the third set of couplings are arranged on the PCB substantially downstream of the first set of couplings with respect to the direction of airflow.

15. The PCB of claim 12, wherein the fourth set of couplings are arranged on the PCB substantially upstream of the third set of couplings with respect to the direction of airflow.

16. The PCB of claim 15, wherein the fourth set of couplings and the third set of couplings are arranged laterally relative to the first set of couplings with respect to the direction of airflow.

17. An optical computer hardware system comprising:
   a plurality of optical transmitter packages each comprising a respective vertical cavity surface emitting laser (VCSEL) to generate optical transmission signals based on electrical transmission signals; and
   a plurality of optical receiver packages each comprising a respective photodiode to generate electrical reception signals based on optical reception signals;
   an application specific integrated circuit (ASIC) to generate the electrical transmission signals and to receive the electrical reception signals;
   a fan to generate airflow across the ASIC; and
   a printed circuit board (PCB) on which the plurality of optical transmitter packages, the plurality of optical receiver packages, the ASIC, and the fan are mounted, the optical transmitter packages being mounted to the PCB to be subjected to less heat from the ASIC than the optical receiver packages with respect to the direction of airflow.

* * * * *